United States Patent
Yamamoto

(10) Patent No.: US 6,696,719 B2
(45) Date of Patent: Feb. 24, 2004

(54) SEMICONDUCTOR DEVICE WITH IMPROVED PERIPHERAL RESISTANCE ELEMENT AND METHOD FOR FABRICATING SAME

(75) Inventor: Ichiro Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/729,803

(22) Filed: Dec. 6, 2000

(65) Prior Publication Data

US 2001/0017385 A1 Aug. 30, 2001

(30) Foreign Application Priority Data

Dec. 9, 1999 (JP) ............................................. 11-350517

(51) Int. Cl.$^7$ ........................ H01L 29/76; H01L 27/108; H01L 29/00
(52) U.S. Cl. ...................... 257/306; 257/296; 257/303; 257/295; 257/533
(58) Field of Search ................................ 257/296, 306, 257/303, 295, 533

(56) References Cited

U.S. PATENT DOCUMENTS

| | | | | |
|---|---|---|---|---|
| 5,463,236 A | * | 10/1995 | Sakao | 257/306 |
| 5,955,774 A | * | 9/1999 | Kang | 257/533 |
| 5,959,319 A | * | 9/1999 | Iwasa | 257/296 |
| 5,973,343 A | * | 10/1999 | Takaishi | 257/296 |
| 6,297,527 B1 | * | 10/2001 | Agarwal et al. | 257/306 |
| 6,316,801 B1 | * | 11/2001 | Amanuma | 257/306 |

FOREIGN PATENT DOCUMENTS

| | | |
|---|---|---|
| JP | 2720815 | 11/1997 |
| JP | 10-56144 | 2/1998 |
| JP | 11-150248 | 6/1999 |
| JP | 11-204755 | 7/1999 |

* cited by examiner

Primary Examiner—Jerome Jackson
Assistant Examiner—Joseph Nguyen
(74) Attorney, Agent, or Firm—Sughrue Mion, PLLC

(57) ABSTRACT

A semiconductor device in which a cell capacitor with an MIM or MIS structure is formed using a conductive material with a low resistivity for the upper electrode and a resistance element is formed using a conductive material with high resistance without increasing the complexity of the fabrication process. A plate electrode used for the upper electrode of the cell capacitor and for the resistance element is made by forming a three-layer structure including a low resistance conductive material layer, an insulating film layer on the low resistance conductive material layer, and a high resistance conductive material layer on the insulating film layer, patterning the three-layer structure in the same shape, and using the low resistance conductive material layer as the upper electrode of the cell capacitor and the high resistance conductive material layer as the resistance element.

6 Claims, 2 Drawing Sheets

SEMICONDUCTOR DEVICE WITH IMPROVED PERIPHERAL RESISTANCE ELEMENT AND METHOD FOR FABRICATING SAME

BACKGROUND OF THE INVENTION

1. Field of the Invention

The present invention relates to a semiconductor device, for example, a semiconductor memory device, having a resistance element in the peripheral circuit region and to the process for its fabrication. More particularly, the invention relates to a dynamic random access memory (DRAM) comprising a resistance element in the attached peripheral circuit region therein and an MIM or MIS structure as a cell capacitor therefor and to the process for its fabrication.

2. Description of the Prior Art

Some kinds of semiconductor devices, such as semiconductor memory devices, are composed of a memory circuit part, for example a memory cell part of a DRAM (a dynamic random access memory), which is a main constituent element thereof, and additionally attached peripheral circuit parts. A self-refresh circuit built in the DRAM is an example of the attached peripheral circuits. In the self-refresh circuit, a timer for the circuit of course includes a resistance element. Development and application of a combined installation type semiconductor memory device and a hybrid type semiconductor memory device comprising a logic circuit as an attached circuit in addition to the memory circuit are just in progress. Under such circumstances, it has been required to fabricate elements constituting various kinds of peripheral circuit parts to be formed together with a memory circuit part, which is a main constituent element, on a single substrate in the same process. For example, a resistance element is one of the elements composing those peripheral circuit parts and formed to have a desired resistance value using a conductive material with a relatively high resistivity.

On the other hand, the integration degree of the above-mentioned memory cell part is rised, and accordingly the surface area of a unit cell is considerably reduced. To accomplish the required reduction in the surface area of the unit cell, a dielectric material having a higher dielectric constant tends to be used for a cell capacitor instead of a conventionally used silicon oxide film or silicon nitride film for, for example, a layered structure of oxide/nitride/oxide films. A capacitor with a MIM or MIS structure is employed using, for example, $Ta_2O_5$ film or various kinds of oxides with perovskite structure as a capacitor insulation film. A high-dielectric oxide material with the above-mentioned perovskite structure to be used for the capacitor insulation film includes, for example, BST (($Ba_xSr_{1-x}$)$TiO_3$) type materials.

When a silicon oxide film or a silicon nitride film is used as the capacitor insulation film in the configuration of a capacitor with the MIM or MIS structure, a polysilicon layer is commonly used for an upper electrode layer (the M layer). The polysilicon layer to be employed for the upper electrode layer may not be a low resistance layer, and indeed such having a resistivity of about $10^{-3}$ Ωcm is also employed. Further owing to the requirement in terms of functions, the polysilicon layer for the above-mentioned upper electrode layer is evenly deposited on an interlayer insulating film by a vapor phase deposition, so that the layer is used, for example, as a resistance layer of a resistance element to be composed in a peripheral circuit part. In other words, the polysilicon layer deposited on an interlayer insulating film of the peripheral circuit part is patterned in a desired shape to obtain a resistance element with a predetermined resistance value.

In the case an oxide such as BST with the perovskite structure is employed as the capacitor insulation film in the configuration of a capacitor with the MIM or MIS structure an undesired phenomenon such as mutual diffusion of formation of a low dielectric layer on the interface is caused by using polysilicon for an electrode layer. In order to avoid such an undesired phenomenon, configuration is employed where a double layer of, for example, Ti (titanium)/TiN (titanium nitride) is formed as a barrier layer to prevent mutual diffusion, or where Ru (ruthenium), Ir (iridium), or the like or its conductive oxide, e.g. $RuO_2$ (ruthenium oxide), $IrO_{O2}$ (iridium oxide), or the like is used for an electrode layer itself. Platinum-group metals such as Ru and their oxides, which all have excellent conductivity, are suitable for an electrode material with sufficiently low resistivity to increase the integration degree and to decrease the capacitor surface area. Further, a double layer of Ti/TiN to be used for the barrier layer to prevent diffusion is also applicable to an electrode material with sufficiently low resistivity, and, even when such a barrier layer is inserted, increase of the resistance in the direction of the electrode layers (increase of series resistance) is not caused.

On the other hand, in the case the above-mentioned material such as Ru or $RuO_2$, or the barrier layer such as Ti/TiN double layer is employed, the sheet resistance in the in-plane direction (the lateral direction) of the whole electrode layer is remarkably low as compared with that of a conventional polysilicon owing to the considerably low resistivity. For that, in a semiconductor device using a polysilicon layer for a conventional cell capacitor upper electrode, the same polysilicon layer is also used as the resistance layer in a resistance element for composing the peripheral circuit part, however in the case material such as Ru or $RuO_2$ is used for the cell capacitor upper electrode, an element configuration in which the conductive material layer for the upper electrode is used as a resistance layer of a resistance element can no longer be applicable. That is, assuming, as illustrated in FIG. 2, the above-mentioned Ru or $RuO_2$ is used for the resistance layer, there is need to employ means of significantly narrowing the line width of the resistance layer or significantly elongating the whole length of the route of the resistance pattern for increasing the resistance value of the resistance element, however it is difficult to employ such means owing to practical restriction relevant to such as the patterning precision and the element size.

SUMMARY OF THE INVENTION

Object of the Invention

Because of the above described reason, in the case material such as Ru or $RuO_2$ is used for the cell capacitor upper electrode, a polysilicon layer having a desired conductivity (resistivity) is required to be separately formed only for the purpose of forming the resistance element and patterned to obtain a predetermined resistance value. It is strongly required to make the element arrangement in the whole semiconductor device practically same as that in a conventional case where a polysilicon layer is used for the cell capacitor upper electrode. In company with that, if a process of composing a resistance element is carried out after a process of patterning Ru or $RuO_2$ of the cell capacitor upper electrode, not only the process takes additional steps but also the polysilicon layer for the resistance element has to be aligned with the patterned upper electrode and patterned at high precision. Increase of the above-mentioned extra patterning steps, especially, a photolithographic step is desirably suppressed, if possible, in the case of highly dense integration and thus an innovative proposal of a semiconductor device structure enabling fabricating a resistance element using a polysilicon layer having a desired conductivity (resistivity) while avoiding the increase of the photolithographic step.

The present invention is to solve the above-mentioned problems and the purposes of the present invention is to provide a semiconductor device structure employing an innovative structure for a plate electrode to be used in a semiconductor device, for example, a semiconductor memory device. For example, in the case of a semiconductor memory device comprising the above-mentioned resistance element composed using a cell capacitor with an MIM or MIS structure wherein a conductive material such as Ru with low resistivity is used for the upper electrode and a conductive material with a high resistance such as polysilicon is used, the purpose is to provide an innovative structure of the semiconductor memory device without practically increased photolithographic steps, compared with the case of fabricating the resistance element using the same conductive material of a conventional cell capacitor upper electrode. More practically, the purpose of the present invention is to provide a new semiconductor memory device structure in which the configuration of the above-mentioned cell capacitor upper electrode and resistance layer of the resistance element and parts in company with them is modified. In addition to that, the present invention has another purpose to provide a process for fabricating the innovative semiconductor memory device configuration, that is, a new fabrication process.

In order to solve the above-mentioned problems, the inventor has tried to re-design the configuration and partial configuration of a cell capacitor upper electrode, a resistance layer of a resistance element and their peripheral parts and to select processing technique applicable for the configuration, and then he has found it possible to carry out patterning without causing unnecessary side etching of a polysilicon layer, which is an uppermost layer and an insulating layer, which is an intermediate layer, at the time when dry etching using etching mask of a photoresist is applied in successive patterning of the three-layer structure in which a polysilicon layer is layered on the insulating layer of such as $SiO_2$ on the layer of a metal or conductive oxide or nitride, e.g. Ru (ruthenium), Ti (titanium), TiN (titanium nitride), Ta (tantalum), TaN (tantalum nitride), W (tungsten), WN (tungsten nitride), Pt (platinum), Ir (iridium) and SRO (strontium-ruthenium-oxide) to be used for the cell capacitor upper electrode. Consequently, it is made sure that a resistance element with a desired element surface area and a predetermined resistance value just as same as those of a resistance element comprising a resistance layer of a conventional polysilicon can be obtained using a polysilicon layer formed by patterning the above-mentioned three-layer structure as the resistance layer. Additionally, it is also found that there are proper conditions of dry etching with high anisotropic degree selectively and separately for the interlayer insulating film, the polysilicon layer, and the insulating film layer in the case of forming the interlayer insulating film on the above-mentioned three-layer structure and forming a contact hole for connecting, for example, an aluminum electrode and wiring formed on the interlayer insulating film with a cell capacitor upper electrode Ru or the like under the interlayer insulating film. Based on those findings, the present invention is achieved.

A semiconductor device of the present invention is a semiconductor device comprising a plate electrode as a constituent element, wherein the plate electrode is made to have a three-layer structure of a low resistance conductive material layer, an insulating film layer with a predetermined film thickness formed on the conductive material layer, and a high resistance conductive material layer formed on the insulating film layer, wherein these three layers of the three-layer structure are patterned in the same shape. For example, the high resistance conductive material layer has a sheet resistance of 50 to $10^{10}$ Ω/□ and the low resistance conductive material layer has a sheet resistance of 1 to 40 Ω/□. Particularly, the high resistance conductive material layer is a conductive material layer using silicon and the low resistance conductive material layer is preferably a layer containing a low resistance conductive material selected from Ti, TiN, Ta, TaN, W, WN, Ru, Pt, Ir and SRO.

Further, in the semiconductor device of the present invention, the low resistance conductive material layer of said electrode with the three-layer structure is used In the case the above-mentioned invention is applied, for example, to a semiconductor memory device, the semiconductor memory device comprises a resistance element in the peripheral circuit part and is characterized by being provided with the resistance element and the cell capacitor composed in the manner wherein: the cell capacitor to be employed for the memory cell of the above-mentioned semiconductor memory device has an MIM or MIS structure composed using a low resistance conductive material selected from a low resistance metal, metal nitride or metal oxide for the upper electrode brought into contact with the dielectric film layer; the above-mentioned resistance element comprises a high resistance conductive material layer as a resistance layer; a three-layer structure is composed of the low resistance conductive material layer, an insulating film layer with a predetermined film thickness and formed on the low resistance conductive material layer, and the high resistance conductive material layer formed on the insulating film layer; and the above-mentioned resistance element and cell capacitor is formed as follows, respectively: the above-mentioned resistance element is formed by patterning the above-mentioned three-layer structure into a predetermined shape and employing only the uppermost high resistance conductive material layer as the resistance layer; and the above-mentioned cell capacitor is formed by patterning the above-mentioned three-layer structure into a predetermined shape of which the lowermost layer is as the upper electrode.

It is preferable to use an oxide with a perovskite structure for the above-mentioned dielectric film layer and to select a low resistance conductive material to be used for the upper electrode of the above-mentioned cell capacitor from Ti, TiN, Ta, TaN, W, WN, Ru, Pt, Ir and SRO. Further, it is preferable to select the same material for the insulating film layer to be the intermediate layer of the above-mentioned three-layer structure as a material to be used for the interlayer insulating film and it is more preferable to select, for example, silicon oxide. In addition to that, polysilicon may be used for the high resistance conductive material layer. Generally, a further interlayer insulating film is formed as to coat the above-mentioned cell capacitor and the resistance element.

The process for fabricating the semiconductor memory device of the present invention is characterized in that: the cell capacitor to be employed for the memory cell of the above-mentioned semiconductor memory device is made to have an MIM or MIS structure composed using a low resistance conductive material selected from a low resistance metal, metal nitride or metal oxide for the upper electrode brought into contact with the dielectric film layer and characterized by comprising steps of layering the above-mentioned low resistance conductive material layer on a substrate; layering an insulating film layer with a described film thickness so as to coat the low resistance conductive material layer; layering a high resistance conductive material layer so as to coat the insulating film layer; forming an etching mask containing a predetermined shape of the above-mentioned resistance element and the predetermined shape of the above-mentioned upper electrode on the layers of the three-layer structure by a photo lithographic method; pattering the three-layer structure by dry etching using the etching mask; and after that removing the etching mask.

In general, it is preferable to carry out a step of forming a further interlayer insulating film so as to coat the high resistance conductive material layer of the resistance element formed by the patterning and a high resistance conductive polysilicon layer coating the upper electrode of the cell capacitor in the same shape after the step of removing the etching mask.

BRIEF DESCRIPTION OF THE DRAWINGS

FIG. 3A shows an example of formation of a leveled interlayer insulating film on a three-layer structure electrode of the present invention, FIGS. 3B to 3D show a series of steps for forming a second contact on the above-mentioned interlayer insulating film and FIG. 3E shows the structure in which an aluminum wiring is formed on the above-mentioned interlayer insulating film and the second contact is formed.

The denotation in the figures means: 1 is a dummy stack; 2 is a Ru layer (upper electrode); 3 is an $SiO_2$ film layer; 4 is a polysilicon layer; 5 is a contact (second contact); 6 is an interlayer insulating film ($SiO_2$) layer; 8 is an Aluminum wiring; and 13 is a Ru layer.

DETAILED DESCRIPTION OF THE PREFERRED EMBODIMENTS

The present invention is to fabricate a resistance element of a peripheral circuit part by using a BST (($Ba_xSr_{1-x}$)$TiO_3$) type material having a higher dielectric constant instead of a conventionally used $Si_3N_4$ as a capacitor insulation film of a cell capacitor and in company with that, in the case material such as Ru and TiN is used for the upper electrode, forming a high resistance conductive material layer of such as a doped polysilicon layer separately from the low resistance conductive material such as Ru and TiN, and using the high resistance conductive material layer for fabricating the resistance element of the peripheral circuit part. At that time, the high resistance conductive material layer is formed on an insulating film layer on the above-mentioned low resistance conductive material layer to form a three-layer structure and the three-layer structure is patterned using a single etching mask formed by photolithographic process to make it possible to obtain a desired resistance element without practi-cally increasing the photolithographic steps as compared with that in a conventional case in which a high resistance conductive material layer such as a doped polysilicon layer is used for the upper electrode. For example, the high resistance conductive material layer is selected from materials with the sheet resistance within a range from 50 to $10^{14}$ $\Omega/\square$ and the desired layer resistance can be obtained by changing the doping concentration of the doped polysilicon layer. On the other hand, the lower resistance conductive material layer is selected from materials with the sheet resistance within a range from 1 to 40 $\Omega/\square$ and a material capable of providing a sheet resistance as low as those may be used.

Figure 1:
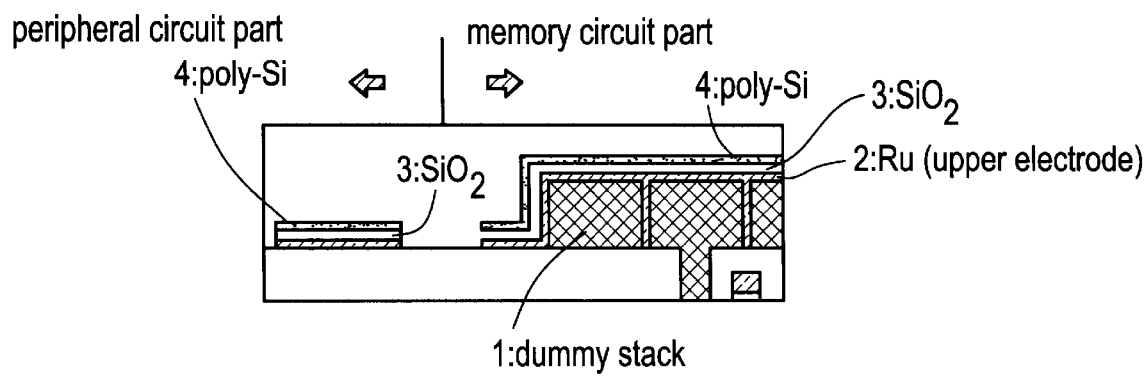
FIG. 1 is a schematic cross-sectional view of an example of a semiconductor device of the present invention.
Figure 3A:
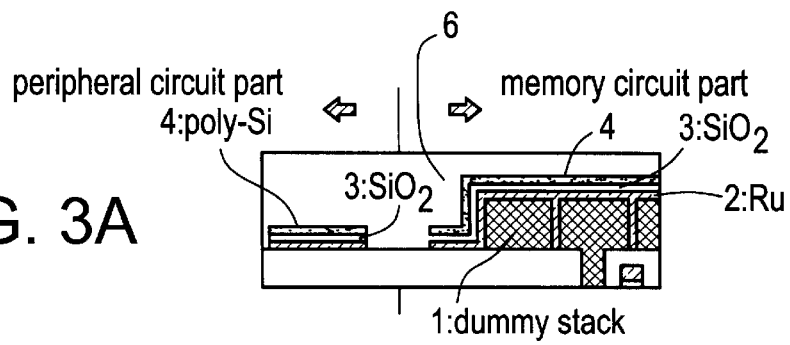
FIGS. 3A to 3E are schematic cross-sectional views of an example of a semiconductor device of the present invention.

Regarding a semiconductor device of the present invention, detailed description will be made below while exemplifying an embodiment in form of a semiconductor memory device. FIG. 1, FIG. 3A and FIG. 3E schematically illustrate the characteristics of the configuration of a semiconductor memory device of the present invention.

In semiconductor memory device of the present invention, in addition to a memory cell part, which is a main constituent part, a peripheral circuit part is formed on the same substrate. As same as such a kind of a conventional semiconductor memory device, a second the above-mentioned memory cell part. A cell capacitor and a resistance element are formed on the second interlayer insulating film. In the examples illustrated in FIG. 1, FIG. 3A and FIG. 3E, the plate electrode formed to have a three-layer structure, which is the characteristic of the present invention, of a low resistance conductive material layer, an insulating film layer with a predetermined film thickness on the conductive material layer, and a high resistance conductive material layer formed on the insulating film layer is employed for fabricating the above-mentioned cell capacitor and resistance element. Practically, in the cell capacitor, the low resistance conductive material layer is used as an upper electrode. Additionally, in the resistance element, the high resistance conductive material layer is utilizing as a resistance layer. The three-layer structure is patterned in the same shape as that of Ru to be an upper electrode in the cell capacitor. On the other hand, also in the resistance element, its patterning is carried out to give the same shape as that of a polysilicon layer of the resistance layer. The above-mentioned low resistance conductive material layer is formed on the whole surface and then the insulating film layer with a predetermined film thickness and the high resistance conductive material layer are layered to form the three-layer structure. After that, in order to carry out patterning of the three-layer structure into a desired shape, an etching mask of a photoresist is formed and the high resistance conductive material layer, the insulating film layer, and the low resistance conductive material layer are successively etched by dry etching and after that the etching mask of the photoresist is removed.

In the example of FIG. 1, an $SiO_2$ layer to be an interlayer insulating film coating the electrode of the three-layer structure is formed and on the other hand, the resistance element is formed on the second interlayer insulating film coating the MOS-FET. The above-mentioned interlayer insulating film is subjected to surface treatment for leveling the surface. In this case, a dummy stack 1 is formed near the cell capacitor to make contact formation easy as shown in FIGS. 3A to 3E.

Figure 3B:
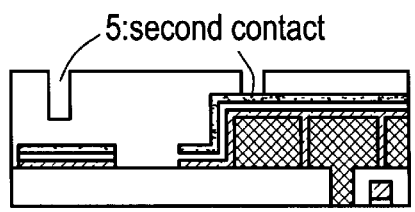

At first, as shown in FIG. 3B, by employing a dry etching method of the interlayer insulating film material whose etching rate for the high resistance conductive material is sufficient, for example, by a drying etching method using $C_4F_8=O_2=Ar$ as an etching gas mixture, with which the etching rate of polysilicon is sufficiently low and $SiO_2$ is selectively etched, etching is carried out for a predetermined duration while utilizing the high resistance conductive material layer on the dummy stack as a stopper.

Figure 3C:
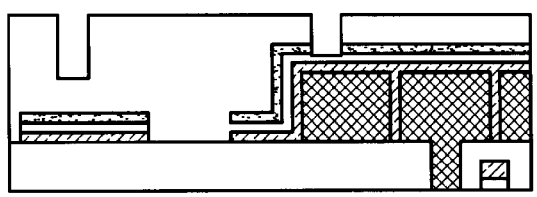

Next, as shown in FIG. 3C, by employing a dry etching method for selectively etching the high resistance conductive material and etching the interlayer insulating film material at a sufficiently low etching rate, for example, by employing a drying etching method using $HBr+O_2+N_2$, with which the etching rate of $SiO_2$ is sufficiently low and the polysilicon is selectively etched, etching is carried out for a predetermined duration while utilizing the interlayer insulating film layer on the dummy stack as a stopper. In that case, by selecting the same material or materials with the similar selective etching properties for the interlayer insulating film and for the insulating film layer, the etching is carried out without reaching the high resistance conductive material layer in the case of forming the contact holes on the resistance element.

Figure 3D:
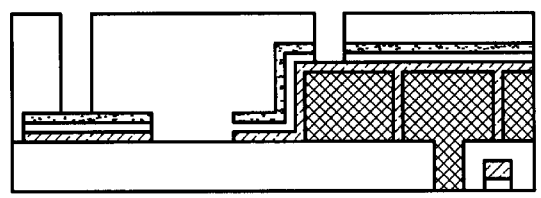
Figure 3E:
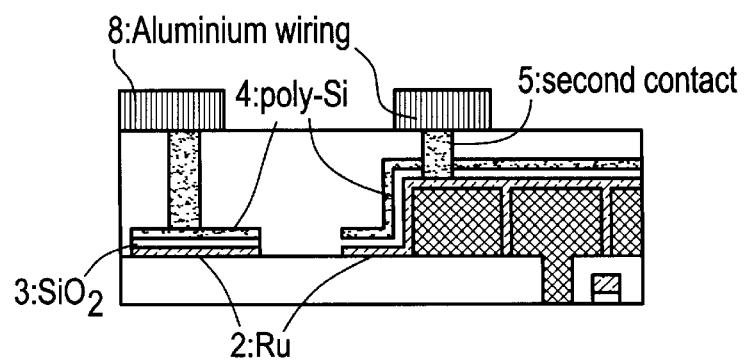

Further, as shown in FIG. 3D, by employing a dry etching method for selectively etching the interlayer insulating film and the insulating film layer and etching the high resistance conductive material and the low resistance conductive material at a sufficiently low etching rate, for example, by employing a drying etching method using $C_4F_8+O_2+Ar$, with which the etching rate of polysilicon and Ru is sufficiently low and $SiO_2$ is selectively etched, etching is carried out for a predetermined duration while utilizing the low resistance conductive material layer on the dummy stack and the high resistance conductive material layer on the resistance element as a stopper. As a result, contact holes are formed as to respectively reach the low resistance conductive material layer on the dummy stack and the high resistance conductive material layer on the resistance element.

After that, the contacts are filled with a metal such as W by a commonly employed method and an aluminum wiring is formed on the interlayer insulating film to obtain a semiconductor memory device with the configuration illustrated in FIG. 3E.

As described above, a material used for the low resistance conductive material layer is properly selected corresponding to the material for a capacitor insulating film composing a capacitor with, for example, an MIM or MIS structure and the film thickness is selected also corresponding to the structure of the capacitor itself of the MIM or MIS structure. In terms of example, in the case $Ta_2O_5$ or BST is used for the above-mentioned capacitor insulating film, it is preferable to use a low resistance conductive material selected from Ti, TiN, Ta, TaN, W, WN, Ru, Pt, Ir and SRO as the capacitor upper electrode. On the other hand, it is preferable to use silicon, for example, a doped silicon for forming a film with a desired conductivity (resistivity) as the high resistance conductive material layer in order to use it for the resistance layer of the resistance element. The insulating film layer to be used between them may have any film thickness as long as the film can keep insulation between them. It is preferable to use a material which does not cause unevenness of the film thickness even in the case that the plane on which deposition is carried out has steps and, for example, $SiO_2$ or the like may preferably be used for the insulating film layer as well as the interlayer insulating film.

By way of practical examples, the characteristics of the device configuration and the fabrication process of a semiconductor device of the present invention, e.g. a semiconductor memory device will be described in detail. Though the examples are a preferable embodiment of the present invention, the present invention is not limited to the illustrated examples.

EXAMPLE 1

FIG. 3E illustrates one representative cross section structure of a semiconductor memory device of the present invention and FIGS. 3A to 3D schematically show the partial process for forming a contact 5 connecting a metal wiring formed on an interlayer insulating film with either a resistance element or a cell capacitor upper electrode during the process of fabricating the semiconductor memory device. As illustrated in FIG. 3E, the semiconductor memory device of the present invention is provided with a peripheral circuit part on a single substrate additionally to a memory cell part, which is a main constituent part. A second interlayer insulating film is formed while coating the MOS-FET of the above-mentioned memory cell part in the same manner as a conventional kind of a semiconductor memory device. A cell capacitor and a resistance element are formed on the second interlayer insulating film.

The cell capacitor is so formed as to have an MIM structure composed of a lower part electrode, a capacitor insulating film, and an upper electrode and formed on the second interlayer insulating film covering the above-mentioned MOS-FET. A dummy stack 1 is formed adjacently to the cell capacitor. The dummy stack 1 is also formed as to have an MIM structure composed of a lower part electrode, a capacitor insulating film, and an upper electrode just as same as the cell capacitor, however being different from the cell capacitor, the dummy stack does not have a contact for electrically communicating with the MOS-FET. Consequently, the MIM structure of the dummy stack does not function as a capacitor.

On the other hand, a resistance element to be formed in the peripheral circuit part is formed on the above-mentioned second interlayer insulating film as same as the cell capacitor. The upper electrode 2 in the MIM structure of the cell capacitor and the dummy stack 1, in this example Ru is employed for the electrode 2, Ru is layered on not only the cell capacitor and the dummy stack 1 but also the upper face of the above-mentioned second interlayer insulating film. The resistance element is fabricated by forming a three-layer structure by forming a $SiO_2$ layer 3 as an insulating film layer on the Ru layer 2 and forming a doped polysilicon layer 4 on the $SiO_2$ layer 3 and then using the doped polysilicon layer 4, which is the uppermost layer, as the resistance layer.

In other words, an etching mask of a photoresist is formed on the doped polysilicon layer 4, which is the uppermost layer of the above-mentioned three-layer structure, the doped polysilicon layer 4, the $SiO_2$ layer 3 and the Ru layer 2 are successively etched by dry etching in a predetermined shape to leave the patterned three-layer structure on the above-mentioned second interlayer insulating film surface to form the resistance element. In the same process, the Ru layer covering the cell capacitor and the dummy stack 1 are patterned in a predetermined shape. As a result, the upper electrode coated with the $SiO_2$ layer 3 and the doped polysilicon layer 4 respectively having the same shape are also patterned on the Ru layer 2 having the defined shape and covering the cell capacitor and the dummy stack 1 in the same process of forming the resistance element. That is, as compared with the case of a conventional structure in which the same doped polysilicon layer is used as the resistance layer of the resistance element and the cell capacitor upper electrode, no photolithographic step is practically added.

Next, $SiO_2$ layer to be an interlayer insulating film 6 is deposited as to coat the cell capacitor upper electrode and the resistance element. In this example, as illustrated in FIG. 3A, the upper face of the deposited $SiO_2$ layer is subjected to CMP (chemomechanical polishing) method to level the upper face of the interlayer insulating film 6. Consequently, the thickness of the $SiO_2$ layer film covering the resistance element is made significantly thicker than the thickness of the $SiO_2$ layer covering the cell capacitor and the dummy stack.

After that, contacts 5 are formed to connect a metal wiring formed on the leveled interlayer insulating film 6, in this case an aluminum wiring 8, with the doped polysilicon layer 4, which is the resistance layer of the above-mentioned resistance element, and with the Ru layer 2, which is an upper electrode of the cell capacitor, respectively. The contact for the resistance element is formed on the doped polysilicon layer, and the contact for the upper electrode of the cell capacitor is formed on the Ru layer of the dummy stack positioned adjacently to the cell capacitor.

At first, an etching mask of a photoresist having openings at the respective contact hole positions is formed, and then, for example using $C_4F_8+O_2+Ar$ as an etching gas mixture, the interlayer insulating film $SiO_2$ layer 6 is dry etched for a proper duration during which etching was extended to reach the doped polysilicon layer on the dummy stack 1 but not to reach the doped polysilicon layer of resistance element. As illustrated in FIG. 3B, the film thickness of the interlayer insulating film $SiO_2$ layer 6 is significantly different at those two points, so that the contact holes could have separately a desirable depth by properly selecting the etching finishing timing corresponding to the film thickness of the interlayer insulating film $SiO_2$ layer 6. Additionally, the dry etching in the condition, for example, of using $C_4F_8+O_2+Ar$ as an etching gas mixture, is carried out at low etching rate in the doped polysilicon or a metal (such as Ru), so that the doped polysilicon layer on the dummy stack 1 is only slightly etched.

Next, in a condition in which the selectivity of the etching rate of doped polysilicon is significant relatively to the etching rate of $SiO_2$, for example, using $HBr+O_2+N_2$ as an etching gas mixture, dry etching is carried out to selectively etch the doped polysilicon layer on the dummy stack 1. Consequently, as illustrated in FIG. 3C, the selective etching is finished at the time when the insulating film layer $SiO_2$ is exposed by properly adjusting the duration of the selective etching of the above-mentioned doped polysilicon layer.

Again, in a drying etching condition using $C_4F_8+O_2+Ar$ as an etching gas mixture in which the etching rate of the doped polysilicon or a metal (such as Ru) is low, drying etching of the interlayer insulating film $SiO_2$ 3 is carried out. By properly selecting the etching duration, the etching of the $SiO_2$ is respectively stopped at the time when etching reaches the upper face of Ru used as the upper electrode on the dummy stack and the upper face of the doped polysilicon layer 4 of the peripheral circuit resistance element while using the respective layers as the stopping layers. As a result, as illustrated in FIG. 3D, for the cell capacitor a contact hole is formed to reach the upper face of Ru to be used as the upper electrode on the dummy stack, and for the resistance element of the peripheral circuit part a contact hole is formed to reach the upper face of the doped polysilicon layer of the resistance layer.

After that, the respective contact holes are filled with a metal such as W by a conventionally employed method. Further, a predetermined aluminum wiring 8 formed on the interlayer insulating film and the above-mentioned contacts 5 are brought into contact with each other. By the above described series of steps, the configuration in which the contacts are formed and aluminum wiring is laid for the upper electrode of the cell capacitor and the resistance layer of the resistance element of the peripheral circuit part is fabricated as illustrated in FIG. 3E.

Figure 2:
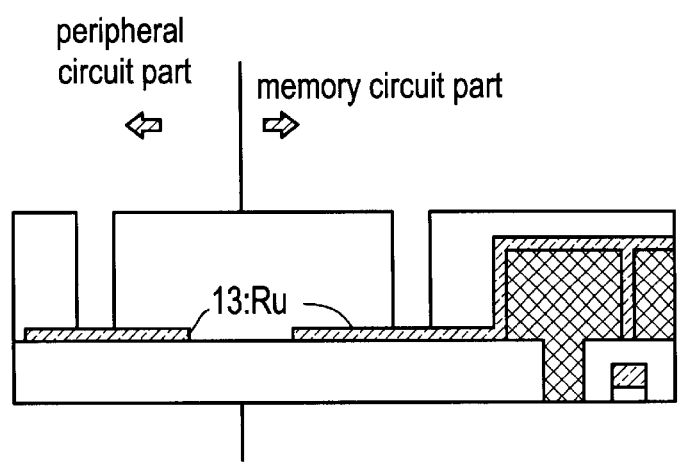
FIG. 2 illustrates a schematic cross-sectional view of a configuration example of a conventional semiconductor device additionally showing the step of forming a second contact.

By employing the above described configuration, that is, a plate electrode of a DRAM with a three-layer structure composed of the doped polysilicon layer 4, the insulating layer 3, and the Ru layer 2, while using the Ru for the cell capacitor upper electrode, the resistance element of the peripheral circuit part can be formed by utilizing the high resistance doped polysilicon layer as same in a conventional case. Consequently, since the resistance element can be formed by utilizing the high resistance doped polysilicon layer as same in a conventional case, the dispersion of the resistance value attributed to the patterning precision at the time of forming the resistance layer with a predetermined line width is actually no way inferior to that of a resistance layer formed by a conventional method. Particularly, in the resistance element in which the low resistance Ru layer is used for the resistance layer as illustrated in FIG. 2, the length of the resistance part of the resistance element is required to be long, and accordingly the surface area to form the resistance element is widened, and in contrast with that, the surface area of the resistance element can be minimized in the configuration of this example.

Advantages of the Invention

In a semiconductor device of the present invention, since a plate electrode is employed which is formed by forming a three-layer structure of a low resistance conductive material layer, an insulating film layer formed on the low resistance conductive material layer, a high resistance conductive material layer on the insulating layer and then patterning the three-layer structure in the same shape, a capacitor with an MIM or MIS structure using such a metal as Ru for the above-mentioned low resistance conductive material layer and using the metal for the upper electrode can be configured, and at that time a resistance element to be employed for a peripheral circuit can also be formed using a doped polysilicon for the high resistance conductive material layer in the same manner as that for a conventional semiconductor device. In application of the invention to, for example, a semiconductor memory device, e.g. a DRAM, the semiconductor memory device is provided with an advantage that the resistance element for the peripheral circuit can be made compact using the doped polysilicon as same as a conventional case and high dense integration is achieved by using such an oxide as BST for the capacitor insulating layer of the cell capacitor.

What is claimed is:

1. A semiconductor device comprising a plate electrode as a constituent element, wherein said plate electrode has a three-layer structure composed of a low resistance conductive material layer, an insulating film layer with a predetermined film thickness on the low resistance conductive material layer, and a high resistance conductive material layer on the insulating film layer, said semiconductor device comprises at least a capacitor used as a cell capacitor for its memory cell and a resistance element, said three layers of the three-layer structure are patterned in the same shape for the resistance element as well as for the capacitor respectively, only the high resistance conductive material layer of said plate electrode formed in the three-layer structure is used as the resistance layer for the resistance element, and the low resistance conductive material layer of said electrode formed in three-layer structure is used as an upper electrode in contact with a dielectric film of the cell capacitor.

2. The semiconductor device according to claim 1, wherein said high resistance conductive material layer has a sheet resistance of 50 to $10^{14}$ $\Omega/\square$ and said low resistance conductive material layer has a sheet resistance of 1 to 40 $\Omega/\square$.

3. The semiconductor device according to claim 1 or 2, wherein said high resistance conductive material layer is a conductive material layer using silicon and said low resistance conductive material layer is a layer comprising a low resistance conductive material selected from the group consisting of Ti (titanium), TiN (titanium nitride), Ta (tantalum), TaN (tantalum nitride), W (tungsten), WN (tungsten nitride), Ru (ruthenium), Pt (platinum), Ir (iridium) and SRO (strontium-ruthenium-oxide).

4. The semiconductor device according to claim 1, wherein said low resistance conductive material layer is used as an upper electrode in contact with a dielectric film of a capacitor in said electrode with the three-layer structure.

5. The semiconductor device according to claim 4, wherein said semiconductor device is a semiconductor memory device comprising said capacitor as a cell capacitor of its memory cell.

6. A semiconductor device comprising a plate electrode as a constituent element, wherein said plate electrode has a three-layer structure composed of a low resistance conductive material layer, an insulating film layer with a predetermined film thickness on the low resistance conductive material layer, and a high resistance conductive material layer on the insulating film layer, said three layers of the three-layer structure are patterned in the same shape, the same shape being discontinuous to form a cell capacitor electrode having an upper surface and a resistance element having an upper surface, a plane formed by the upper surface of the cell capacitor electrode is distinct from a plane formed by the upper surface of the resistance element, only the high resistance conductive material layer of said plate electrode formed in three-layer structure is used as the resistance layer for the resistance element, and the low resistance conductive material layer of said electrode formed in three-layer structure is used as an upper electrode in contact with a dielectric film of the cell capacitor.

* * * * *